US009490203B2

(12) United States Patent
Tsai et al.

(10) Patent No.: US 9,490,203 B2
(45) Date of Patent: Nov. 8, 2016

(54) CAPACITOR IN POST-PASSIVATION STRUCTURES AND METHODS OF FORMING THE SAME

(71) Applicant: Taiwan Semiconductor Manufacturing Company, Ltd., Hsin-Chu (TW)

(72) Inventors: Hao-Yi Tsai, Hsin-Chu (TW); Hsien-Wei Chen, Hsin-Chu (TW); Hung-Yi Kuo, Taipei (TW); Tung-Liang Shao, Hsin-Chu (TW); Ying-Ju Chen, Tuku Township (TW); Tsung-Yuan Yu, Taipei (TW); Jie Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/144,066

(22) Filed: May 2, 2016

(65) Prior Publication Data

US 2016/0247757 A1    Aug. 25, 2016

Related U.S. Application Data

(60) Continuation of application No. 14/851,828, filed on Sep. 11, 2015, now Pat. No. 9,355,954, which is a continuation of application No. 14/504,128, filed on Oct. 1, 2014, now Pat. No. 9,136,318, which is a division of application No. 13/728,819, filed on Dec. 27, 2012, now Pat. No. 8,884,400.

(51) Int. Cl.
| H01L 21/66 | (2006.01) |
| H01L 21/768 | (2006.01) |
| H01L 23/52 | (2006.01) |
| H01L 23/485 | (2006.01) |
| H01L 23/522 | (2006.01) |

(Continued)

(52) U.S. Cl.
CPC ....... *H01L 23/5223* (2013.01); *H01L 23/3171* (2013.01); *H01L 23/522* (2013.01); *H01L 23/5226* (2013.01); *H01L 23/5329* (2013.01); *H01L 24/03* (2013.01); *H01L 24/05* (2013.01);
(Continued)

(58) Field of Classification Search
CPC ........... H01L 23/5329; H01L 23/5223; H01L 23/5226; H01L 23/522; H01L 23/3171; H01L 23/48; H01L 23/50; H01L 21/76838; H01L 29/00; H01L 28/60
USPC ......... 257/72, 528, 531, 532, 535, 758, 774, 257/E21.008, E21.411, E21.531, E21.159, 257/E21.579, E27.024, E29.342; 438/17, 438/34, 381, 627, 642, 648, 653
See application file for complete search history.

(56) References Cited

U.S. PATENT DOCUMENTS

| 6,426,249 B1 | 7/2002 | Geffken et al. |
| 7,759,768 B2 * | 7/2010 | Barth ................... H01L 23/5223 257/528 |

(Continued)

FOREIGN PATENT DOCUMENTS

| CN | 102456751 A | 5/2012 |
| TW | 201320305 | 5/2013 |

*Primary Examiner* — Dao H Nguyen
(74) *Attorney, Agent, or Firm* — Slater & Matsil, LLP

(57) ABSTRACT

A device includes a metal pad and a passivation layer having a portion overlapping the metal pad. A capacitor includes a bottom capacitor electrode underlying the passivation layer, wherein the bottom capacitor includes the metal pad. The capacitor further includes a top capacitor electrode over the portion of the passivation layer; and a capacitor insulator including the portion of the passivation layer.

20 Claims, 9 Drawing Sheets

(51) Int. Cl.
*H01L 23/00* (2006.01)
*H01L 49/02* (2006.01)
*H01L 23/31* (2006.01)
*H01L 23/532* (2006.01)
*H01L 23/50* (2006.01)
*H01L 23/48* (2006.01)

(52) U.S. Cl.
CPC ............... *H01L 28/60* (2013.01); *H01L 23/48* (2013.01); *H01L 23/50* (2013.01); *H01L 2224/0391* (2013.01); *H01L 2224/0401* (2013.01); *H01L 2224/05624* (2013.01); *H01L 2224/05647* (2013.01); *H01L 2924/1205* (2013.01)

(56) References Cited

U.S. PATENT DOCUMENTS

| | | | |
|---|---|---|---|
| 8,148,798 B2 | 4/2012 | Yamagata | |
| 2002/0037643 A1 | 3/2002 | Ishimaru | |
| 2005/0020021 A1 | 1/2005 | Fujiwara et al. | |
| 2008/0258260 A1 | 10/2008 | Nagai et al. | |
| 2009/0008783 A1 | 1/2009 | Saigoh et al. | |
| 2010/0203655 A1* | 8/2010 | Ayotte | H01L 22/34 438/17 |
| 2011/0108845 A1* | 5/2011 | Kwon | H01L 27/322 257/72 |
| 2012/0056322 A1 | 3/2012 | Saigoh et al. | |
| 2012/0112314 A1 | 5/2012 | Jou et al. | |
| 2013/0113094 A1* | 5/2013 | Wu | H01L 23/3171 257/737 |
| 2013/0119392 A1* | 5/2013 | Park | H01L 27/326 257/72 |
| 2013/0186754 A1* | 7/2013 | Ackerson | G01N 27/3276 204/403.01 |
| 2013/0270675 A1 | 10/2013 | Childs et al. | |
| 2013/0307119 A1 | 11/2013 | Chen et al. | |
| 2013/0334502 A1 | 12/2013 | Liu | |
| 2014/0183693 A1 | 7/2014 | Tsai et al. | |
| 2015/0017778 A1 | 1/2015 | Tsai et al. | |

* cited by examiner

CAPACITOR IN POST-PASSIVATION STRUCTURES AND METHODS OF FORMING THE SAME

PRIORITY CLAIM AND CROSS-REFERENCE

This application is a continuation of U.S. patent application Ser. No. 14/851,828, entitled "Capacitor in Post-Passivation Structures and Methods of Forming the Same," filed Sep. 11, 2015, which application is a continuation application of U.S. patent application Ser. No. 14/504,128, entitled "Capacitor in Post-Passivation Structures and Methods of Forming the Same," filed Oct. 1, 2014, now U.S. Pat. No. 9,136,318, which application is a divisional of U.S. patent application Ser. No. 13/728,819, entitled "Capacitor in Post-Passivation Structures and Methods of Forming the Same," filed on Dec. 27, 2012, now U.S. Pat. No. 8,884,400, which application is incorporated herein by reference.

BACKGROUND

In integrated circuit applications, more and more functions are integrated into products. For example, different functional elements such as 3G video elements, WiFi elements, Bluetooth elements, and audio/video elements may need to be integrated together to form an application. A commonly known application for these devices is the mobile application, in which mobile devices such as cell phones are formed.

Capacitors are widely used in the mobile applications. The capacitors may need to adapt to high frequencies when used in the mobile applications. For example, the Q factors of the capacitors need to be high enough in radio frequencies. The breakdown voltages, the leakage currents, and the like, also need to suit to the respective applications.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A capacitor formed at least partially in a Post-Passivation Interconnect (PPI) structure and the method of forming the same are provided in accordance with an embodiment. The intermediate stages of manufacturing the capacitor in accordance with various embodiments are illustrated. The variations of the embodiments are discussed. Throughout the various views and illustrative embodiments, like reference numbers are used to designate like elements.

Figure 1:
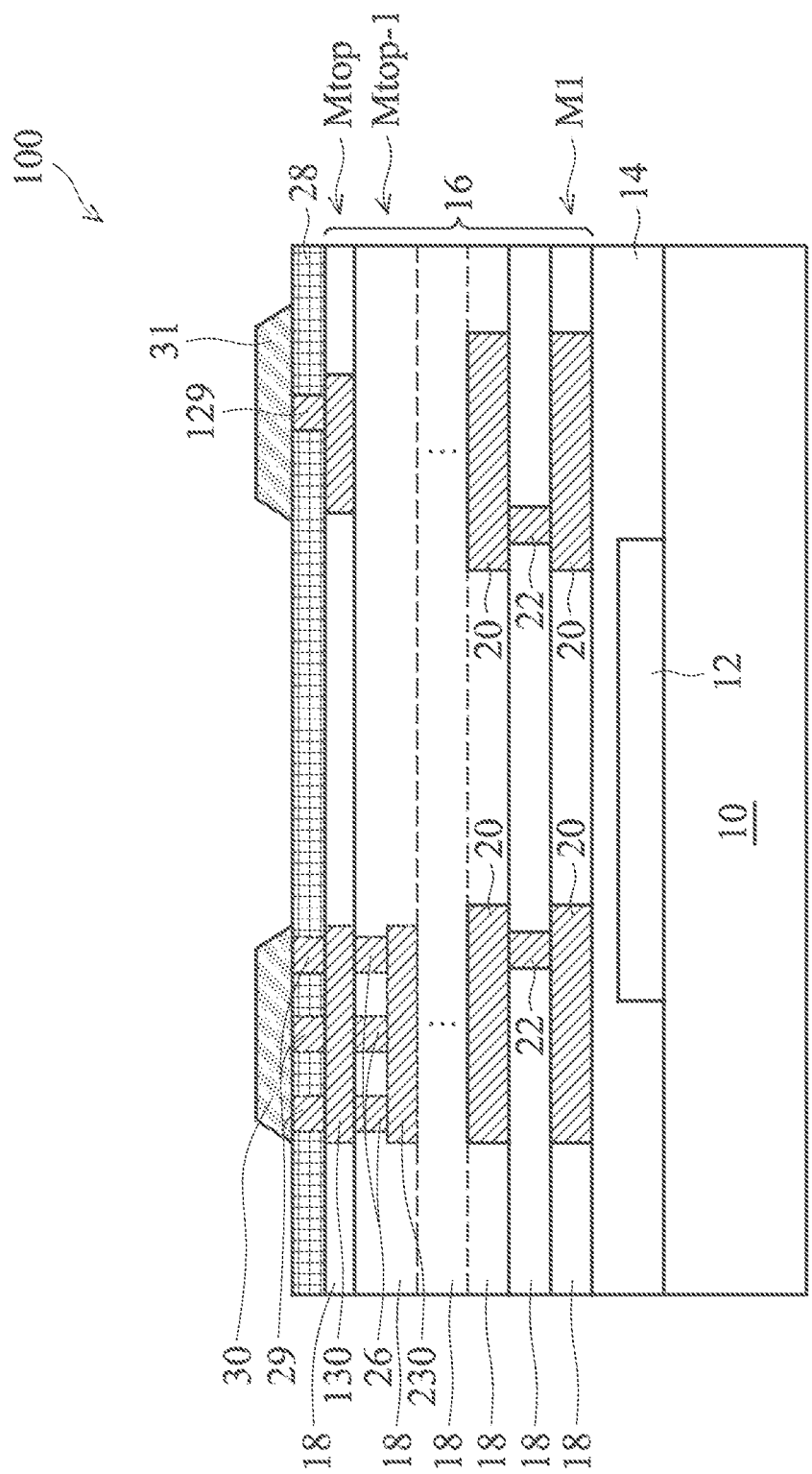
FIGS. 1 through 5 are cross-sectional views of intermediate stages in the manufacturing of a wafer comprising a capacitor in accordance with some exemplary embodiments, wherein at least a portion of the capacitor is formed in a Post-Passivation Interconnect (PPI) structure.

Referring to FIG. 1, wafer 100, which includes semiconductor substrate 10, is provided. Semiconductor substrate 10 may be a bulk silicon substrate or a silicon-on-insulator substrate. Alternatively, other semiconductor materials that include group III, group IV, and group V elements may also be used, which may include silicon germanium, silicon carbon, and III-V compound semiconductor materials. Integrated circuit devices such as transistors (schematically illustrated as 12) are formed in and/or on semiconductor substrate 10. Wafer 100 may further include Inter-Layer Dielectric (ILD) 14 over semiconductor substrate 10, and interconnect structure 16 over ILD 14. Interconnect structure 16 includes metal lines 20 and vias 22, which are formed in dielectric layers 18. The combination of metal lines 20 at a same level is referred to a metal layer hereinafter. Accordingly, interconnect structure 16 may include a plurality of metal layers that are interconnected through vias 22. Metal lines 20 and vias 22 may be formed of copper or copper alloys, although they can also be formed of other metals. In some embodiments, dielectric layers 18 are formed of low-k dielectric materials. The dielectric constants (k values) of the low-k dielectric materials may be less than about 3.0, or less than about 2.5, for example.

The metal layers include a bottom metal layer (M1) through a top metal layer (Mtop). In some embodiments, the Mtop layer is the topmost metal layer that is formed in low-k dielectric materials. Metal pad 130 may be formed in the Mtop layer. Metal pad 230 may also be formed in Mtop−1 layer, which is the metal layer immediately underlying the Mtop layer. Metal pads 130 and 230 are interconnected through vias 26.

In some embodiments, passivation layer 28 is formed over top metal layer Mtop and the respective dielectric layer 18 in which metal layer Mtop is located. Passivation layer 28 has a k value greater than 3.8, and is formed using a non-low-k dielectric material. In some embodiments, passivation layer 28 is a composite layer comprising a silicon oxide layer (not shown), and a silicon nitride layer (not shown) over the silicon oxide layer. Passivation layer 28 may also be formed of other non-porous dielectric materials such as Un-doped Silicate Glass (USG), silicon oxynitride, and/or the like. Vias 29 and 129 are formed in passivation layer 32, and may be electrically coupled to integrated circuit devices 12. Vias 29 are over and connected to metal pad 130.

Metal pads 30 and 31 are formed over passivation layer 28, and may be electrically coupled to integrated circuit devices 12 through metal lines 20 and vias 22. Metal pads 30 and 31 may be aluminum pads or aluminum-copper pads, and hence are alternatively referred to as aluminum pads 30 and 31 hereinafter, although other metallic materials may be used. Furthermore, aluminum pad 30 may have a top-view size and a top-view shape similar to the top view sizes and the top-view shapes, respectively, of metal pads 130 and 230.

Figure 2:
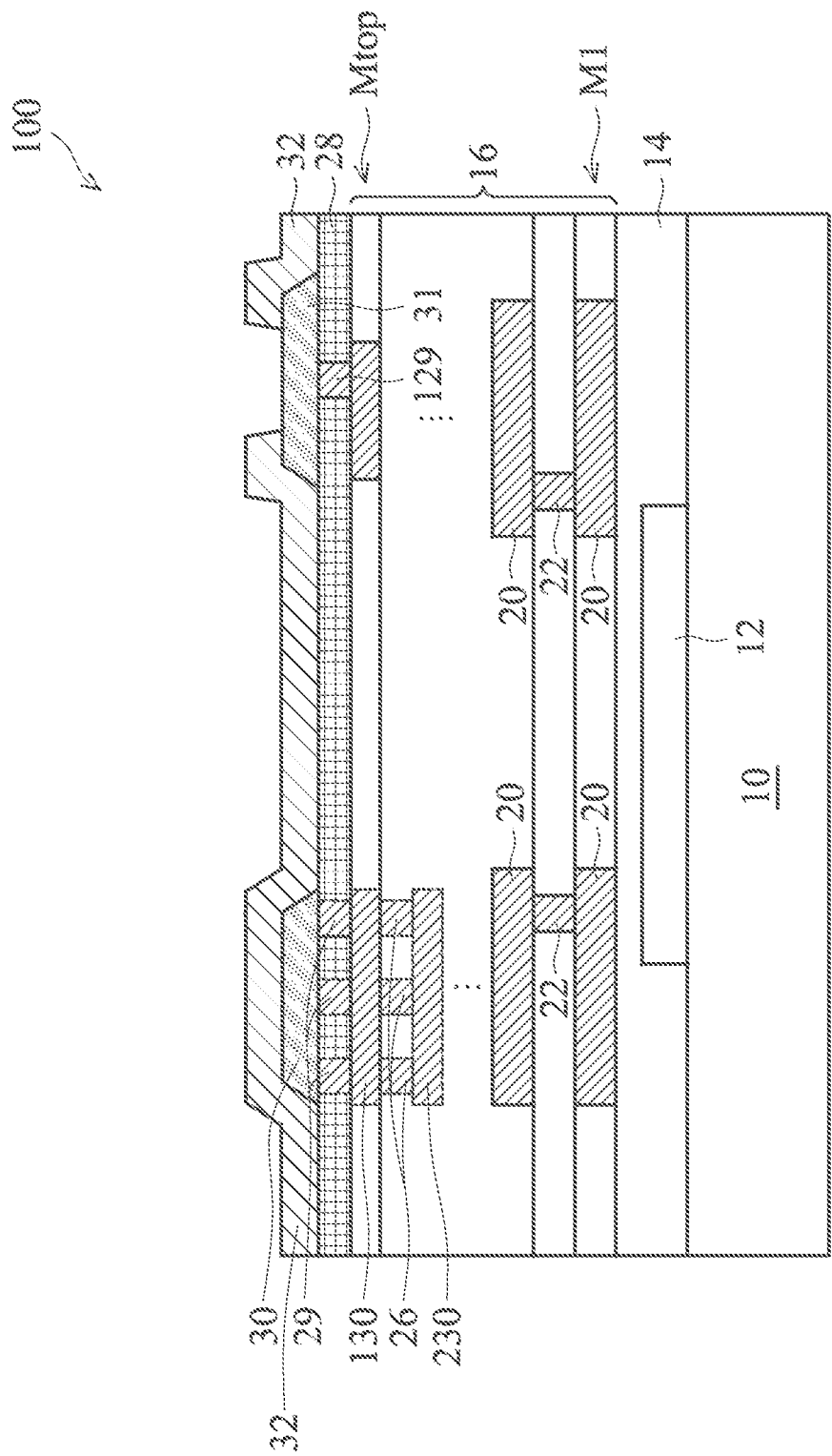

Referring to FIG. 2, passivation layer 32 is formed over passivation layer 28. The material of passivation layer 32 may be selected from the same candidate materials of passivation layer 28. Passivation layers 28 and 32 may be formed of a same dielectric material, or may be formed of different dielectric materials. In some embodiments, passivation layer 32 includes a silicon oxide layer, and a silicon nitride layer over the silicon oxide layer. Passivation layer 32 is patterned, so that a portion of passivation layer 32 covers the edge portions of aluminum pad 31, and a central portion of aluminum pad 31 is exposed through an opening in passivation layer 32. An entirety of aluminum pad 30 is covered by passivation layer 32. Passivation layer 32 may also include a portion level with metal pad 30.

Figure 3:
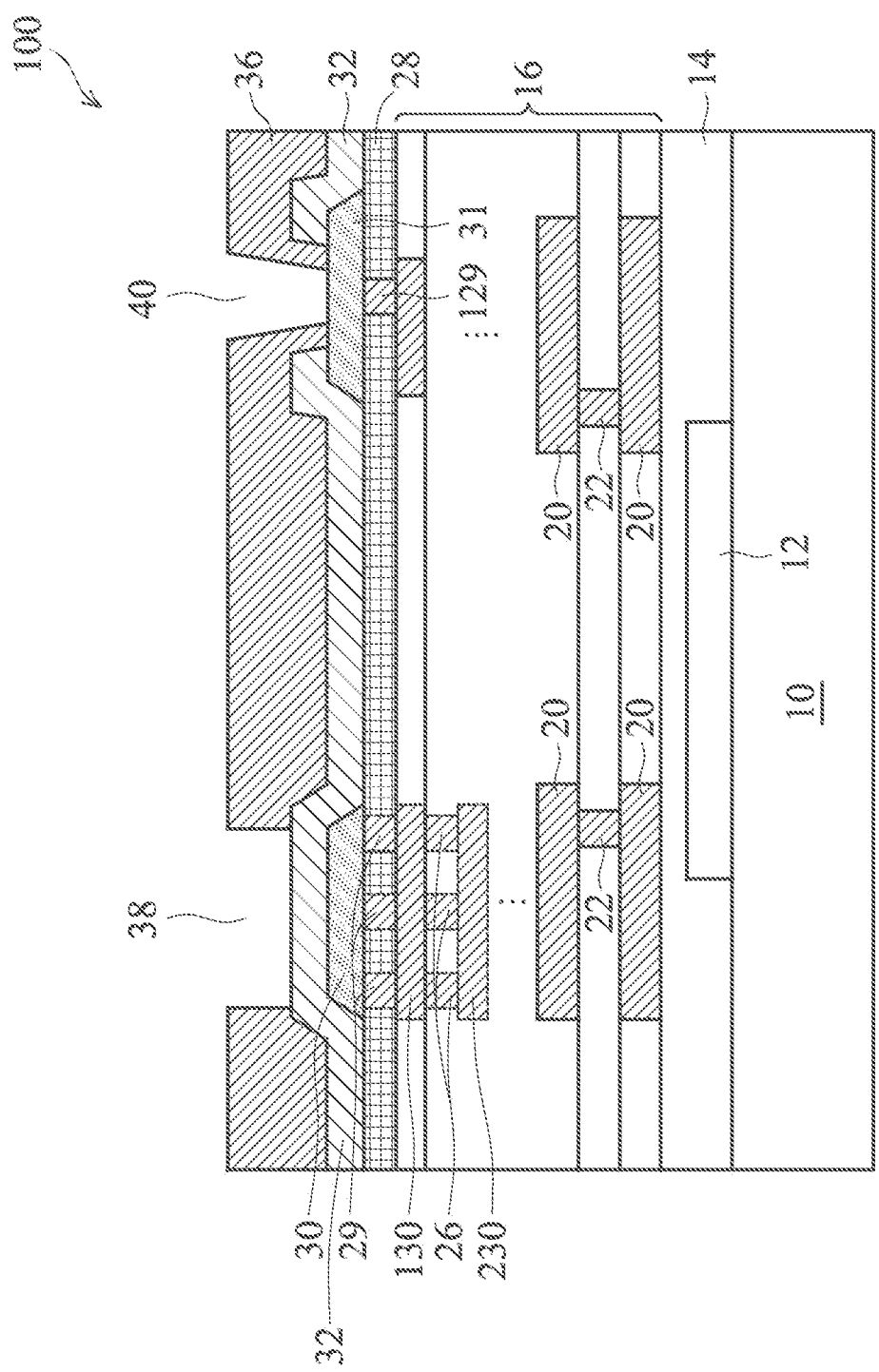

Referring to FIG. 3, polymer layer 36 is formed over passivation layer 32. Polymer layer 36 may comprise a polymer selected from polyimide, BenzoCycloButene (BCB), PolyBenzOxazole (PBO), and/or the like. The formation methods may include spin coating, for example. Polymer layer 36 may be dispensed in a liquid form, and then cured.

Polymer layer 36 is patterned to form openings 38 and 40. Opening 40 is aligned to a portion of aluminum pad 31, wherein aluminum pad 31 is exposed through opening 40. Opening 38 overlaps aluminum pad 30. In some embodiments, opening 38 has a top view size and a top-view shape similar to the top view sizes and the top-view shapes of aluminum pad 30, metal pad 130, and/or metal pad 230. Passivation layer 32 is exposed through opening 38. In some embodiments, the patterning of polymer layer 36 is performed using passivation layer 32 as an etch stop layer. In the embodiments that polymer layer 36 is formed of a photo-sensitive material, polymer layer 36 is patterned by exposing to light through a lithography mask (not shown). The exposed polymer layer 36 is then developed to form openings 38 and 40.

Figure 4:
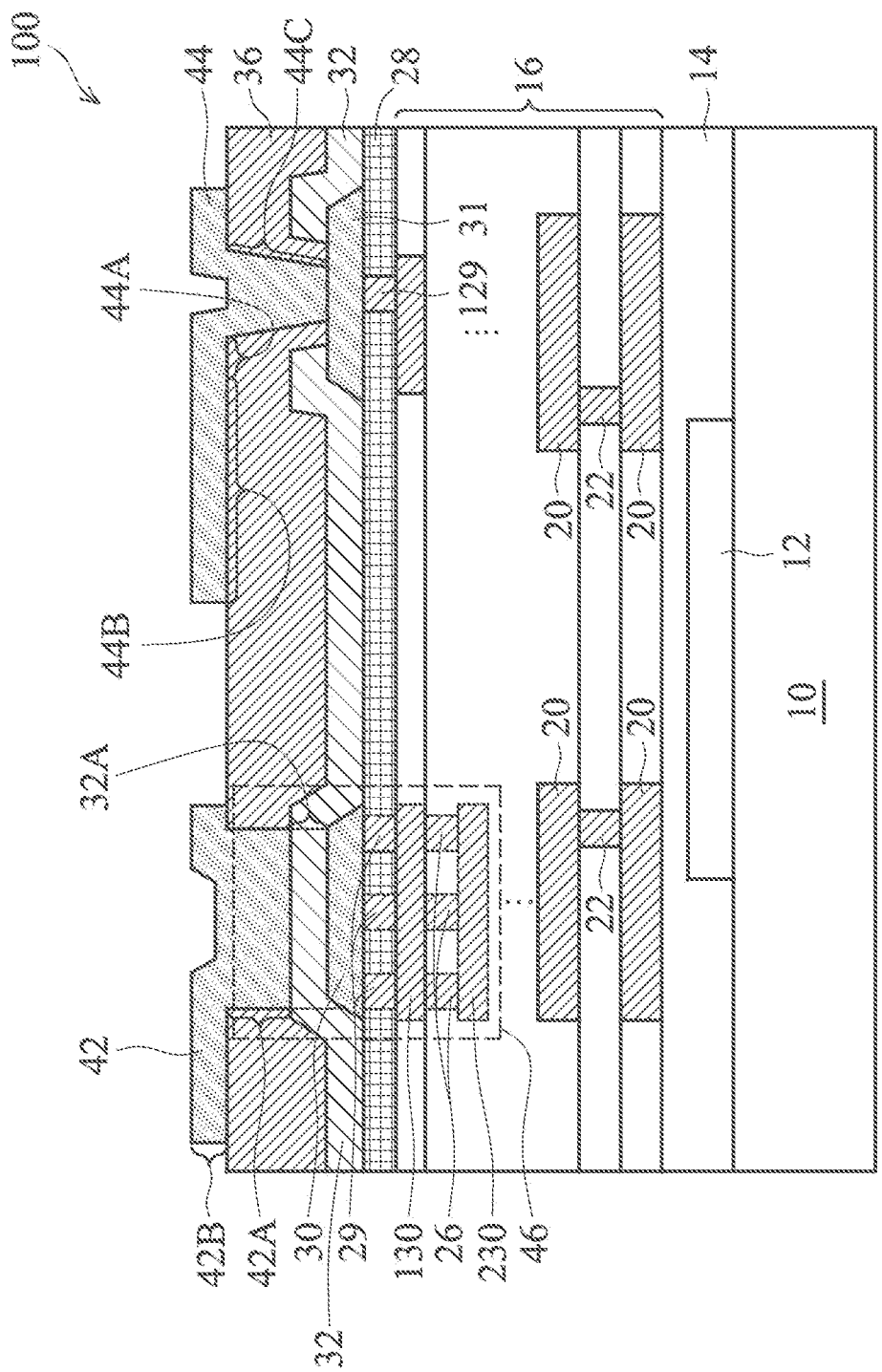

FIG. 4 illustrates the formation of PPIs 42 and 44, which are such named since the formation of PPIs 42 and 44 is after the formation of passivation layer 32. In some embodiments, the formation of PPIs 42 and 44 includes depositing a seed layer (not shown), forming a patterning mask (not shown) over the seed layer, and plating a metallic material (not shown) over the seed layer. The mask layer is then removed, and the portions of the seed layer covered by the mask layer are removed. The remaining portions of the seed layer and the metallic material form PPIs 42 and 44.

PPI 42 includes portion 42A, which is in opening 38 (FIG. 3), and portion 42B overlying polymer layer 36. PPI portion 42A, metal pad 30, and portion 32A of passivation layer 32 therebetween in combination form capacitor 46, wherein PPI portion 42A acts as the top capacitor electrode of capacitor 46, metal pad 30 acts as the bottom capacitor electrode of capacitor 46, and passivation portion 32A acts as the capacitor insulator.

PPI 44 includes PPI line 44A and PPI pad 44B, which is wider (in the top view) than PPI line 44A. PPI 44 further includes portion 44C extending into opening 40 (FIG. 3) to electrically connect to aluminum pad 31.

Figure 5:
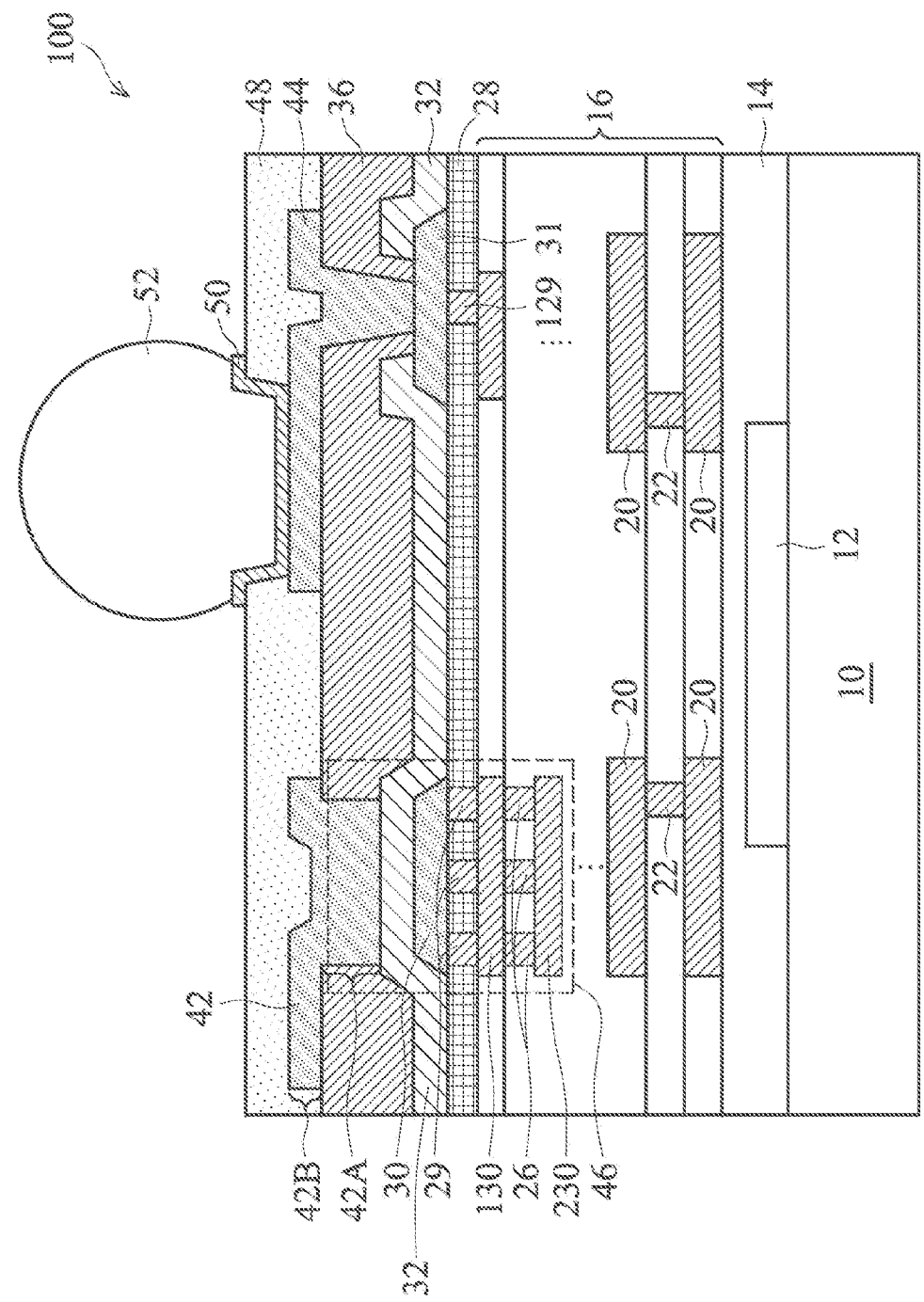

FIG. 5 illustrates the formation of polymer layer 48 and Under-Bump-Metallurgy (UBM) 50. First, polymer layer 48 is formed over the structure in FIG. 4. Polymer layer 48 may be formed of a material selected from the same group of candidate materials for forming polymer layer 36. For example, polymer layer 48 may comprise polyimide or another polymer-based material such as PBO, BCB, or the like. Polymer layer 48 may be formed using spin coating.

Next, UBM layer 50 is formed. In some embodiments, UBM layer 50 includes a barrier layer and seed layer (not shown) over the barrier layer. UBM layer 50 extends into the opening in polymer layer 48, and is electrically coupled to, and may be in physical contact with, PPI 44. The barrier layer may be a titanium layer, a titanium nitride layer, a tantalum layer, a tantalum nitride layer, or layers formed of a titanium alloy or a tantalum alloy. The materials of the seed layer may include copper or copper alloys. UBM layer 50 may be formed using PVD or other applicable methods. In some embodiments, an entirety of PPI 42 is covered by polymer layer 48. Alternatively, a UBM similar to UBM 50 and a connector similar to connector 52 may be formed to electrically connect to PPI 42.

Further referring to FIG. 5, connector 52 is formed. In some embodiments, connector 52 is a metal region, which is either a metal ball, such as a solder ball or a copper ball, placed on UBM layer 50, or a metal pillar formed on UBM layer 50 through plating. The metal region may then go through a reflow process, and metal ball 52 is formed. In alternative embodiments, connector 52 comprises a metal pillar, which may be a copper pillar. Additional layers such as a nickel layer, a solder cap, a palladium layer, and the like, may also be formed on the metal pillar.

Figure 6:
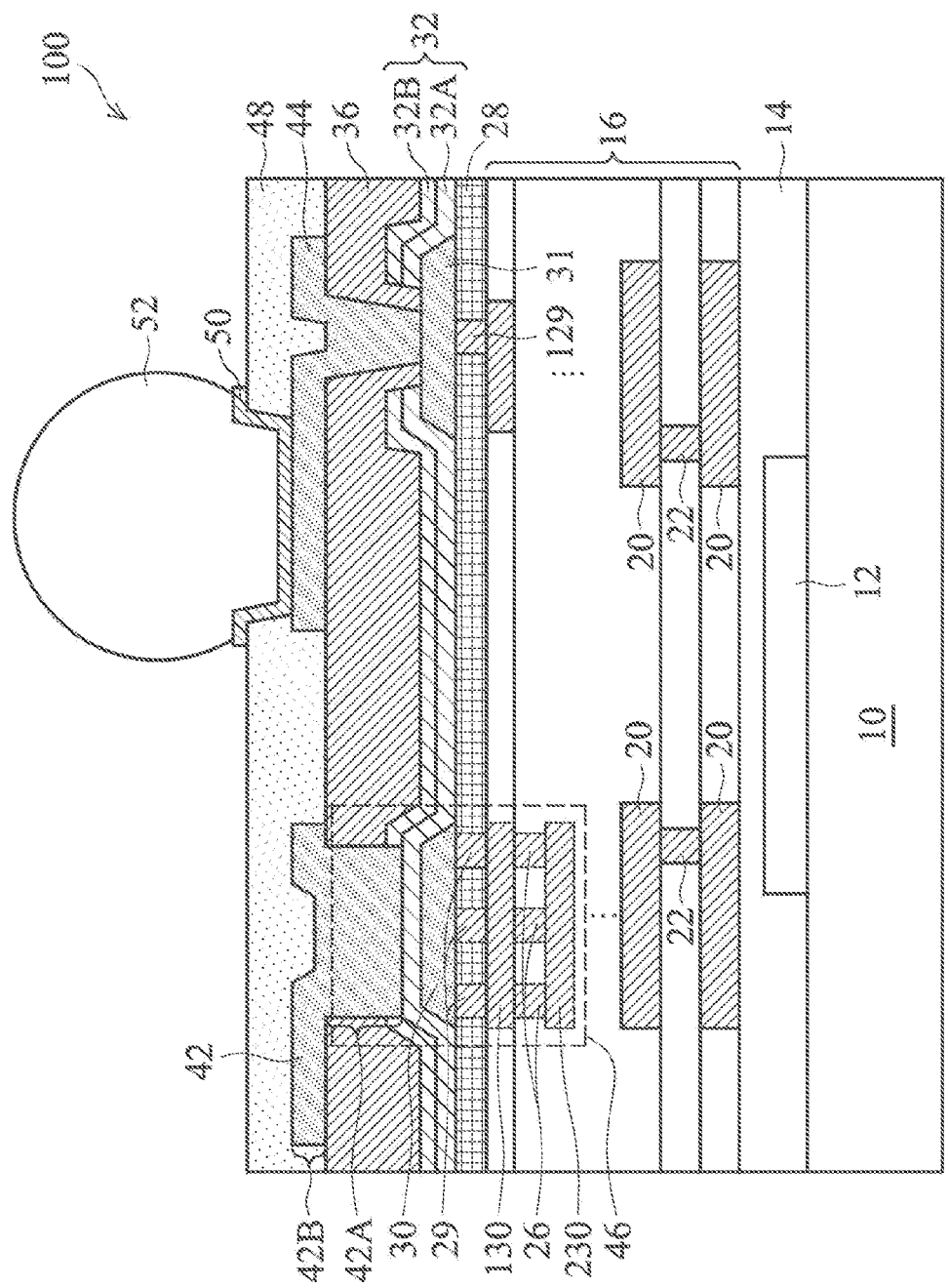
FIGS. 6 and 7 are cross-sectional views of the capacitor-comprising wafer in accordance with alternative embodiments.

In some embodiments, as shown in FIG. 5, top electrode 42A of capacitor 46 lands on the top surface of passivation layer 32. Accordingly, the thickness of the capacitor insulator of capacitor 46 is substantially equal to the thickness of passivation layer 32. In alternative embodiments, as shown in FIG. 6, top electrode 42A extends down into passivation layer 32, and hence the thickness of the capacitor insulator of capacitor 46 is smaller than the thickness of passivation layer 32. As a result, the capacitance of capacitor 46 is increased. In some embodiments, passivation layer 32 includes a plurality of sub layers that are formed of different dielectric materials. Top electrode 42A may land on a lower sub layer, while penetrating through an upper sub layer. For example, as shown in FIG. 6, passivation layer 32 includes lower sub layer 32A, and upper sub layer 32B over lower sub layer 32A. Lower sub layer 32A may comprise silicon oxide, and upper sub layer 32B may comprise silicon nitride. Top electrode 42A may penetrate through upper layer 32B in these embodiments to contact the top surface of lower sub layer 32A. In the formation of the structure in FIG. 6, lower sub layer 32A may be used as an etch stop layer when upper sub layer 32B is patterned.

Figure 7:
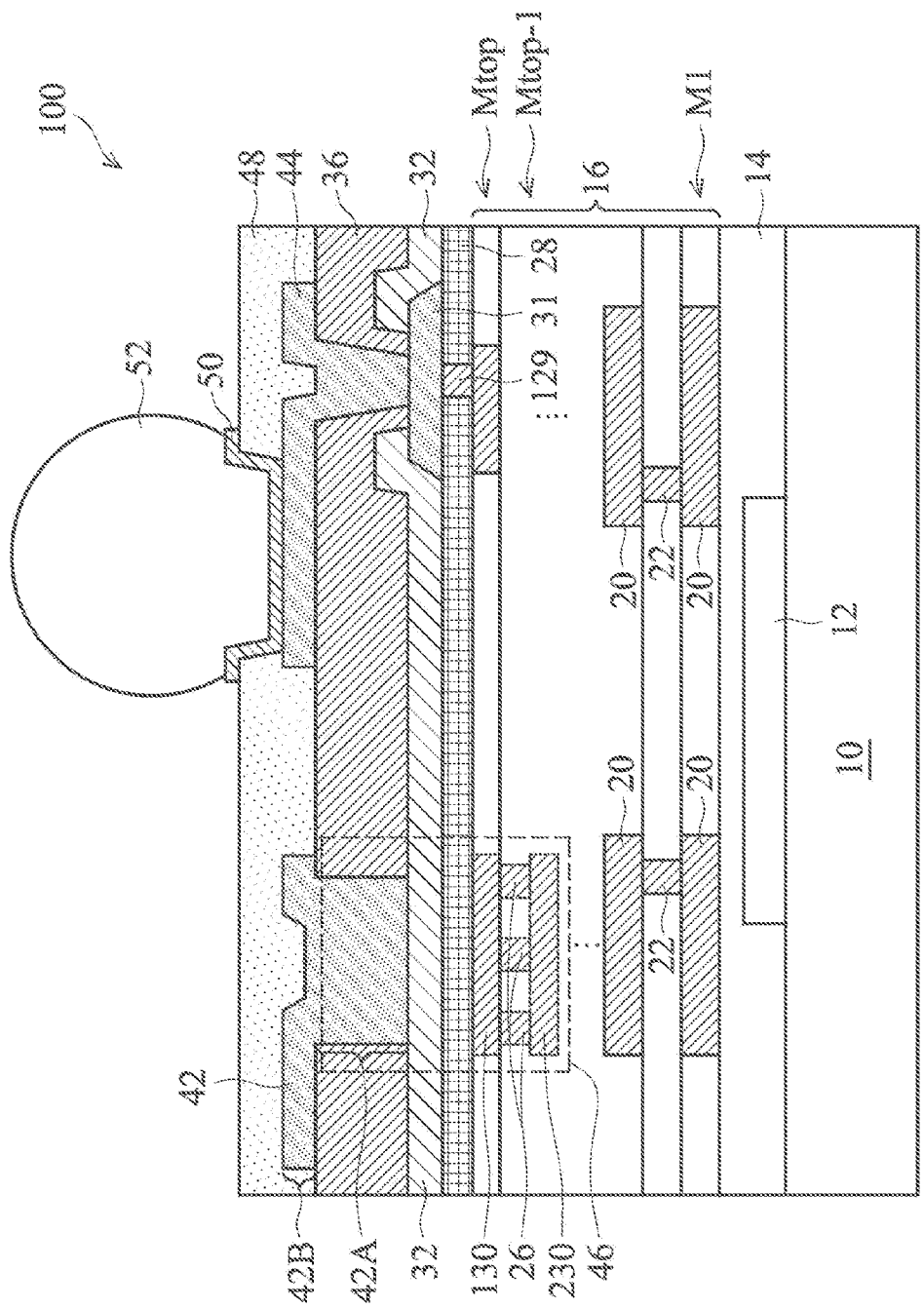

In some embodiments, as shown in FIGS. 5 and 6, the bottom electrode of capacitor 46 includes a plurality of metal pads, which may include one or more of aluminum pad 30, metal pad 130 in top metal layer Mtop, and possibly metal pad 230 in metal layer Mtop−1. The plurality of metal pads is interconnected through vias 26 and 29 to form an integrated bottom capacitor electrode. By using a plurality of metal pads to form the bottom electrode, the electrical performance of the resulting capacitor 46 is improved, particularly for high-frequency applications. In alternative embodiments, as shown in FIG. 7, the bottom electrode of capacitor 46 does not include aluminum pad 30. Accordingly, metal pads 130 and/or 230 form the bottom capacitor electrode. The capacitor insulator in these embodiments accordingly includes both passivation layers 28 and 32 in these embodiments.

Figure 8:
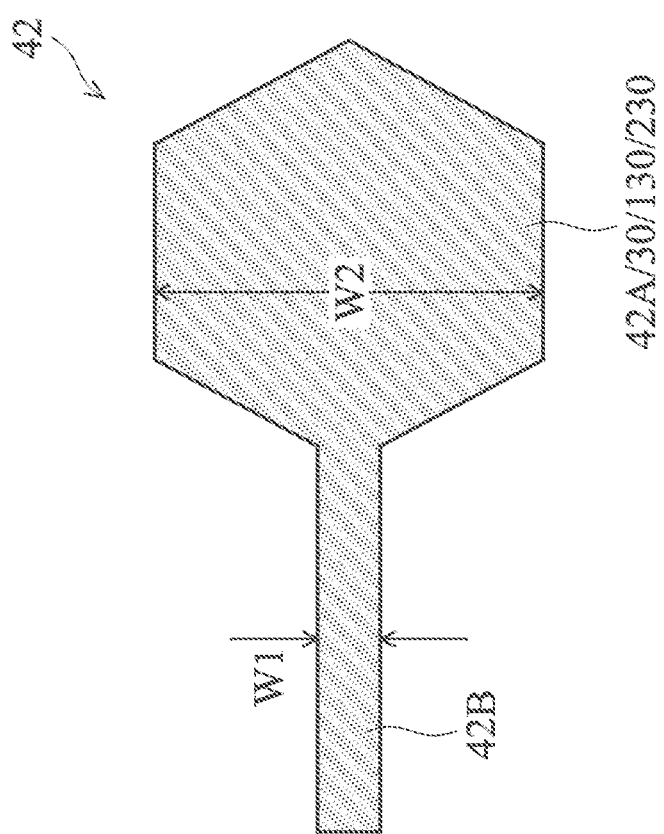
FIG. 8 is a top view of a capacitor and the respective connecting PPI line.

FIG. 8 illustrates a top view of PPI 42 and capacitor 46. In some embodiments, the portion 42B (also referred to as a PPI line hereinafter) of PPI 42 has width W1, and top electrode 42A and bottom electrode 30/130/230 have width W2, wherein widths W1 and W2 are measured in the direction perpendicular to the longitudinal direction of PPI line 42B. Ratio W2/W1 may be greater than 2, greater than 5, or greater than 10.

Figure 9:
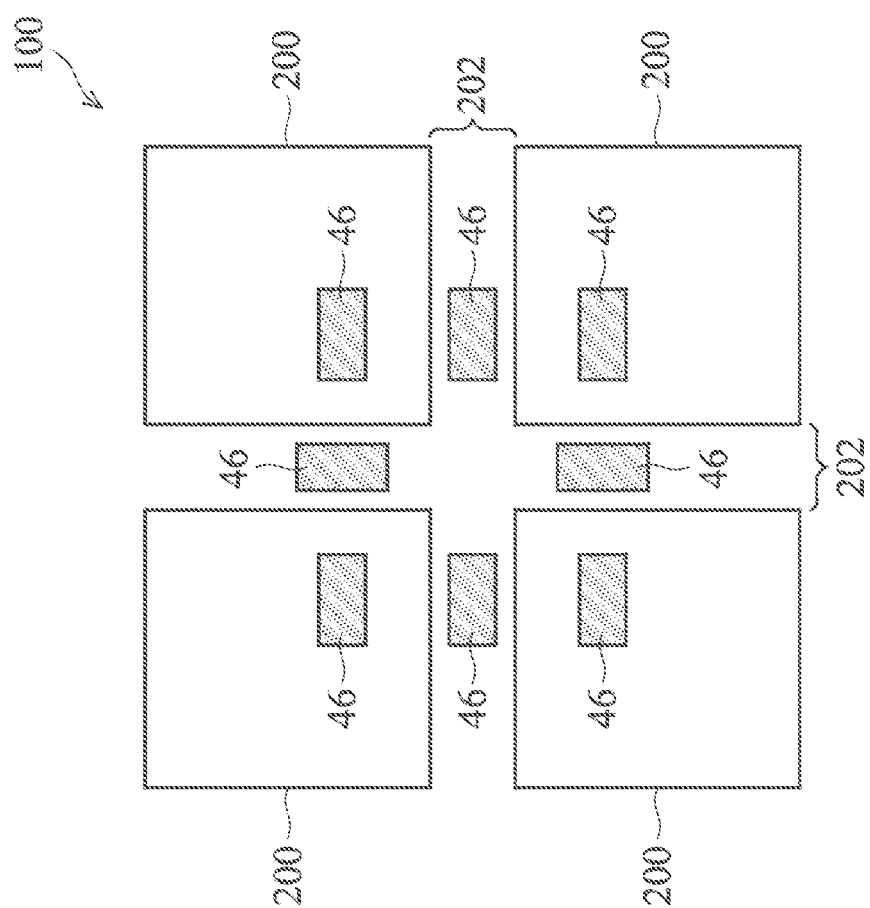
FIG. 9 illustrates a top view of a portion of the wafer, in which the capacitors are formed.

FIG. 9 illustrates the top view of a portion of wafer 100, which includes chips 200 therein. Chips 200 are spaced apart from each other by scribe lines 202, which will be sawed to separate chips 200 from each other in a subsequent die-saw process. Some of capacitors 46 may be formed in scribe lines 202. Accordingly, by probing the capacitance values of these capacitors 46, the manufacturing process may be monitored. For example, by measuring the capacitance values of these capacitors 46, the uniformity of passivation layer 32 and polymer layer 48, which thicknesses affect the capacitance values, may be monitored. Some of capacitors 46 may be formed inside chips 200, and used in RF applications, mobile applications, and the like.

The capacitors in accordance with embodiments may not incur extra process cost. For example, referring to FIG. 2, the formation of the capacitor insulator may be achieved by modifying the lithography mask for patterning passivation layer 32, and hence no extra cost is involved.

In accordance with some embodiments, device includes a metal pad and a passivation layer having a portion overlapping the metal pad. A capacitor includes a bottom capacitor electrode underlying the passivation layer, wherein the bottom capacitor includes the metal pad. The capacitor further includes a top capacitor electrode over the portion of the passivation layer; and a capacitor insulator including the portion of the passivation layer.

In accordance with other embodiments, a device includes plurality of low-k dielectric layers, a metal pad over the plurality of low-k dielectric layers, and a passivation layer including a portion overlapping the metal pad, wherein the passivation layer includes a non-low-k dielectric material. A polymer layer is formed over the passivation layer. A PPI includes a first portion over the polymer layer, and a second portion penetrating through the polymer layer to contact the passivation layer. The second portion overlaps the metal pad to form a capacitor with the metal pad. The portion of the passivation layer overlapping the metal pad acts as a capacitor insulator of the capacitor.

In accordance with yet other embodiments, a method includes forming a passivation layer over a metal pad, wherein the metal pad is further over a plurality of low-k dielectric layers. A polymer layer is formed over the passivation layer. The polymer layer is patterned to form an opening, wherein the opening overlaps the metal pad. A PPI is then formed to include a first portion over the polymer layer and a second portion in the opening. The second portion of the PPI is spaced apart from the metal pad by a portion of the passivation layer. The second portion of the PPI, a portion of the passivation layer, and the metal pad form a top capacitor electrode, a capacitor insulator, and a bottom capacitor electrode, respectively, of the capacitor.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a first passivation layer covering a first conductive feature and a second conductive feature;
   forming a first polymer layer over the first passivation layer, wherein the first polymer layer is in contact with a top surface of the first conductive feature, and is spaced apart from the second conductive feature by the first passivation layer; and
   filling a conductive material into the first polymer layer, wherein the conductive material comprises a first portion contacting the first conductive feature, and a second portion extending into the first polymer layer and overlapping the second conductive feature, and wherein the second portion of the conductive material forms a capacitor with the second conductive feature.

2. The method of claim 1 further comprising performing a lithography process on the first polymer layer to form a first opening and a second opening in the first polymer layer, wherein the first conductive feature is exposed to the first opening, and the second conductive feature is covered by a portion of the first passivation layer after the lithography process.

3. The method of claim 2 further comprising patterning the first passivation layer to form an additional opening in the first passivation layer, wherein the first conductive feature is exposed through the additional opening, and the first polymer layer extends into the additional opening.

4. The method of claim 3, wherein when the conductive material is filled, at least a lower sub-layer of a portion of the first passivation layer is not removed, and the lower sub-layer of the portion of the first passivation layer overlaps the second conductive feature.

5. The method of claim 1 further comprising:
   forming second passivation layer, with the first conductive feature and the second conductive feature overlying the second passivation layer; and
   forming a first via and a second via in the second passivation layer, wherein the first via and the second via are underlying and connected to the first conductive feature and the second conductive feature, respectively.

6. The method of claim 1, wherein the first conductive feature and the second conductive feature are metal pads comprising aluminum and copper.

7. The method of claim 1, wherein after the conductive material is filled, a portion of the first passivation layer forms a capacitor insulator of the capacitor.

8. The method of claim 1 further comprising:
   forming a second polymer layer over the first polymer layer and the first portion and the second portion of the conductive material; and
   patterning the second polymer layer to form a third opening, with the first portion of the conductive material exposed through the third opening.

9. The method of claim 8, wherein after the second polymer layer is patterned, an entirety of the second portion of the conductive material is covered by the second polymer layer.

10. The method of claim 1, wherein the forming the first passivation layer comprises forming a first sub-layer and a second sub-layer over the first sub-layer, with the first and the second sub-layers being formed of different dielectric materials, and the first portion of the conductive material penetrates through both the first sub-layer and the second sub-layer, and the second portion of the conductive material penetrates through the second sub-layer, and lands on a top surface of the first sub-layer.

11. A method comprising:
forming a first metal pad and a second metal pad in a low-k dielectric layer:
forming a non-low-k dielectric layer over and contacting the first metal pad, the second metal pad, and the low-k dielectric layer;
forming a via in the non-low-k dielectric layer to connect to the first metal pad, with no via in the non-low-k dielectric layer and directly overlying the second metal pad;
forming a third metal pad over the non-low-k dielectric layer to connect to the via, with no metal pad formed to overlap the second metal pad when the third metal pad is formed;
depositing a passivation layer to cover the third metal pad;
patterning the passivation layer to expose the third metal pad;
forming a first polymer layer over the passivation layer;
patterning the first polymer layer to form a first opening and a second opening in the first polymer layer, wherein the third metal pad is exposed through the first opening, and a top surface of a portion of the passivation layer directly overlying the second metal pad is exposed through the second opening; and
filling a conductive material comprising a first portion in the first opening, and a second portion in the second opening, wherein the second portion of the conductive material forms a capacitor with the second metal pad, and wherein a portion of the non-low-k dielectric layer and the portion of the passivation layer directly overlying the second metal pad in combination forms a capacitor insulator of the capacitor.

12. The method of claim 11 further comprising patterning the passivation layer to form an additional opening in the passivation layer, wherein the first metal pad is exposed through the additional opening, and the first polymer layer is filled into the additional opening.

13. The method of claim 11, wherein the third metal pad comprises aluminum and copper.

14. The method of claim 11 further comprising:
forming a second polymer layer over the first polymer layer and the first portion and the second portion of the conductive material; and
patterning the second polymer layer to form a third opening, with the first portion of the conductive material exposed through the third opening.

15. The method of claim 14, wherein after the second polymer layer is patterned, an entirety of the second portion of the conductive material is covered by the second polymer layer.

16. A method comprising:
forming a dielectric layer comprising a first portion and a second portion overlapping a first metal pad and a second metal pad, respectively;
etching the dielectric layer to remove the first portion of the dielectric layer;
partially etching the dielectric layer to remove an upper portion of the second portion of the dielectric layer, with a lower portion of the second portion of the dielectric layer remaining;
forming a first polymer layer over the dielectric layer;
patterning the first polymer layer comprising:
removing a first portion of the first polymer layer to form a first opening, with the first metal pad exposed through the first opening; and
removing a second portion of the first polymer layer to form a second opening, with the lower portion of the second portion of the dielectric layer exposed to the second opening; and
filling a conductive material comprising a first portion in the first opening and a second portion in the second opening, wherein the first portion of the conductive material is in contact with the first metal pad, and the second portion of the conductive material contacts a top surface of the lower portion of the second portion of the dielectric layer.

17. The method of claim 16, wherein the upper portion and the lower portion of the dielectric layer are formed of different dielectric materials.

18. The method of claim 17, wherein the lower portion of the dielectric layer is formed of silicon oxide, and the upper portion of the dielectric layer is formed of silicon nitride.

19. The method of claim 16 further comprising:
forming a second polymer layer over the first polymer layer and the first and the second portions of the conductive material; and
patterning the second polymer layer to form a third opening, wherein the first portion of the conductive material is exposed through the third opening, and the second portion of the conductive material remains to be covered by the second polymer layer.

20. The method of claim 16 further comprising forming a solder region to electrically couple to the first portion of the conductive material, and no solder region is directly over and electrically connected to the second portion of the conductive material.

* * * * *